(12) United States Patent
Teggatz et al.

(10) Patent No.: US 9,225,293 B2
(45) Date of Patent: Dec. 29, 2015

(54) POP AND CLICK NOISE REDUCTION

(75) Inventors: Ross E. Teggatz, McKinney, TX (US);
Wayne T. Chen, Plano, TX (US); Brett Smith, McKinney, TX (US)

(73) Assignee: TRIUNE SYSTEMS, LLC, Plano, TX (US)

( * ) Notice: Subject to any disclaimer, the term of this patent is extended or adjusted under 35 U.S.C. 154(b) by 590 days.

(21) Appl. No.: 13/540,920

(22) Filed: Jul. 3, 2012

(65) Prior Publication Data

US 2013/0028441 A1    Jan. 31, 2013

Related U.S. Application Data

(60) Provisional application No. 61/506,135, filed on Jul. 10, 2011.

(51) Int. Cl.
*H03F 1/30* (2006.01)
*H03F 3/217* (2006.01)
*H03K 5/1252* (2006.01)

(52) U.S. Cl.
CPC .............. *H03F 1/305* (2013.01); *H03F 3/2173* (2013.01); *H03K 5/1252* (2013.01)

(58) Field of Classification Search
CPC ....... H04B 15/00; H03G 3/345; H03G 3/348; H03F 1/305; H03F 3/2173; H03F 2200/03; G11B 20/10527; H03K 5/1252
USPC ......................................................... 381/94.5
See application file for complete search history.

(56) References Cited

U.S. PATENT DOCUMENTS

| 5,642,076 | A | * | 6/1997 | Naokawa et al. | ............. 330/149 |
| 5,796,303 | A | * | 8/1998 | Vinn et al. | ....................... 330/51 |
| 2003/0228024 | A1 | * | 12/2003 | Hayama | ....................... 381/94.5 |
| 2004/0151329 | A1 | * | 8/2004 | Judge et al. | .................. 381/94.5 |
| 2004/0223624 | A1 | * | 11/2004 | Inagaki | ......................... 381/120 |
| 2006/0182266 | A1 | * | 8/2006 | Cusinato et al. | ............... 379/395 |
| 2007/0121961 | A1 | * | 5/2007 | Tsai | ............................. 381/94.5 |
| 2007/0139103 | A1 | * | 6/2007 | Roeckner et al. | ............... 330/10 |
| 2009/0196435 | A1 | * | 8/2009 | Miao | ............................. 381/94.5 |

* cited by examiner

*Primary Examiner* — Simon Sing
(74) *Attorney, Agent, or Firm* — Jackson Walker L.L.P.; Christopher J. Rourk

(57) ABSTRACT

Disclosed are advances in the arts with novel and useful electronic circuitry with pop and click noise reduction. A load circuit is connected with a full or single-ended half-H bridge circuit and another circuit mechanism in a configuration by which a signal may be used to selectably bring the load circuit terminals to a selected voltage level when an externally applied signal is not present.

29 Claims, 5 Drawing Sheets

POP AND CLICK NOISE REDUCTION

PRIORITY ENTITLEMENT

This application is entitled to priority based on Provisional Patent Application Ser. No. 61/506,135 filed on Jul. 10, 2011, which is incorporated herein for all purposes by this reference. This application and the Provisional Patent Application have at least one common inventor.

TECHNICAL FIELD

The invention relates to apparatus for controlling the output of circuits and systems. More particularly, the invention relates to apparatus for reducing pops and clicks caused by the initial application of power to load elements in electronic systems.

BACKGROUND OF THE INVENTION

For audio power amplifiers, pop and click noises during power-up and power-down of systems is undesirable and irritating to users. For amplifiers using only a single power supply, the speaker is often biased at mid-rail. However, prior to powering up the system, the voltage on the output of the amplifier and on the speaker terminals is at 0V. This is further complicated with class-D amplifiers, for example, that use inductors, resistors, and capacitors to filter the switching frequency, as these components require charging up from an off state, e.g., 0V, as well. This problem extends to other electronic circuits and systems in addition to audio circuits, such as data transmittal systems for example.

Due to these and other problems and potential problems with the current state of the art, improved apparatus for controlling output to load elements and preventing or attenuating pops and clicks in electronic systems would be a useful and advantageous contribution to the art.

SUMMARY OF THE INVENTION

In carrying out the principles of the present invention, in accordance with preferred embodiments, the invention provides advances in the arts with novel apparatus and associated methods directed to useful and advantageous improvements to electronic systems.

According to one aspect of the invention, an example of a preferred embodiment of pop and click reduction in a circuit includes a load element with its terminals connected to a bridge circuit. An op amp circuit is used for bringing the terminals of the load element to a selected voltage level, such as mid-rail. The circuit is configured such that the op amp output is turned on in the absence of a load signal and turned off when a load signal is present.

According to another aspect of the invention, in an exemplary embodiment a reduced pop and click circuit includes an op amp circuit connected within the circuit for bringing the terminals of a load element to a selected voltage level. The op amp receives feedback from a load terminal and turns off when the load receives a signal at the output node of the bridge circuit.

According to another aspect of the invention, in an exemplary embodiment, an electronic circuit includes a load circuit including at least a load element and first and second terminals, each of which includes a capacitor. A bridge circuit has an output node connected to the load circuit. An op amp is situated to receive an input signal and to supply an output signal to bring the terminals of the load to a selected voltage level. The op amp receives feedback from a load terminal and turns off when the voltage level at the load circuit is not zero.

According to another aspect of the invention, in an example of a preferred embodiment, an electronic circuit has a load element. A bridge circuit has an output node connected with one load terminal and a feedback node connected with a second load terminal. A first op amp is provided for receiving an input signal and for supplying an output signal to the bridge circuit feedback node, and for also supplying the same output signal as an input to a second op amp coupled for providing an output signal to the bridge circuit output node. The op amp output signals are used to bring the terminals of the load to a selected voltage level without transiting the load element.

According to another aspect of the invention, in an exemplary embodiment, a selector circuit is included for selecting either an output signal from an external origin destined for the load or a wave-shape signal for transmittal to the terminals of a load element.

According to yet another aspect of the invention, an example of a preferred embodiment includes a selector circuit for selecting either an externally provided load signal or a wave-shape signal for transmittal to the terminals of a load. The circuit also includes an op amp electrically connected with one or more load terminal in a configuration adapted for selection from among an op amp output signal, external signal, or internal class-D output signal.

The invention has advantages including but not limited to providing reductions in pop and click noise in an electronic system. This and other advantageous features and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as front, back, top, bottom, upper, side, et cetera; refer to the drawings themselves as laid out on the paper and not to physical limitations of the invention unless specifically noted. The drawings are not to scale, and some features of embodiments shown and discussed are simplified or amplified for illustrating principles and features, as well as advantages of the invention.

DESCRIPTION OF PREFERRED EMBODIMENTS

While the making and using of various exemplary embodiments of the invention are discussed herein, it should be appreciated that the present invention provides inventive concepts which can be embodied in a wide variety of specific contexts. It should be understood that the invention may be practiced with various audio systems and functionally similar non-audio systems in which initial voltage control is desirable without altering the principles of the invention. The examples of circuits and techniques shown and described herein are representative embodiments, and may be used in various combinations. For purposes of clarity, detailed descriptions of functions, components, and systems familiar to those skilled in the applicable arts are not included. In general, the invention provides novel and advantageous advances in terms of improving systems by providing standby voltage to output devices, such as audio speakers for example, in order to smooth the transition from an inactive to an active state.

Figure 1:
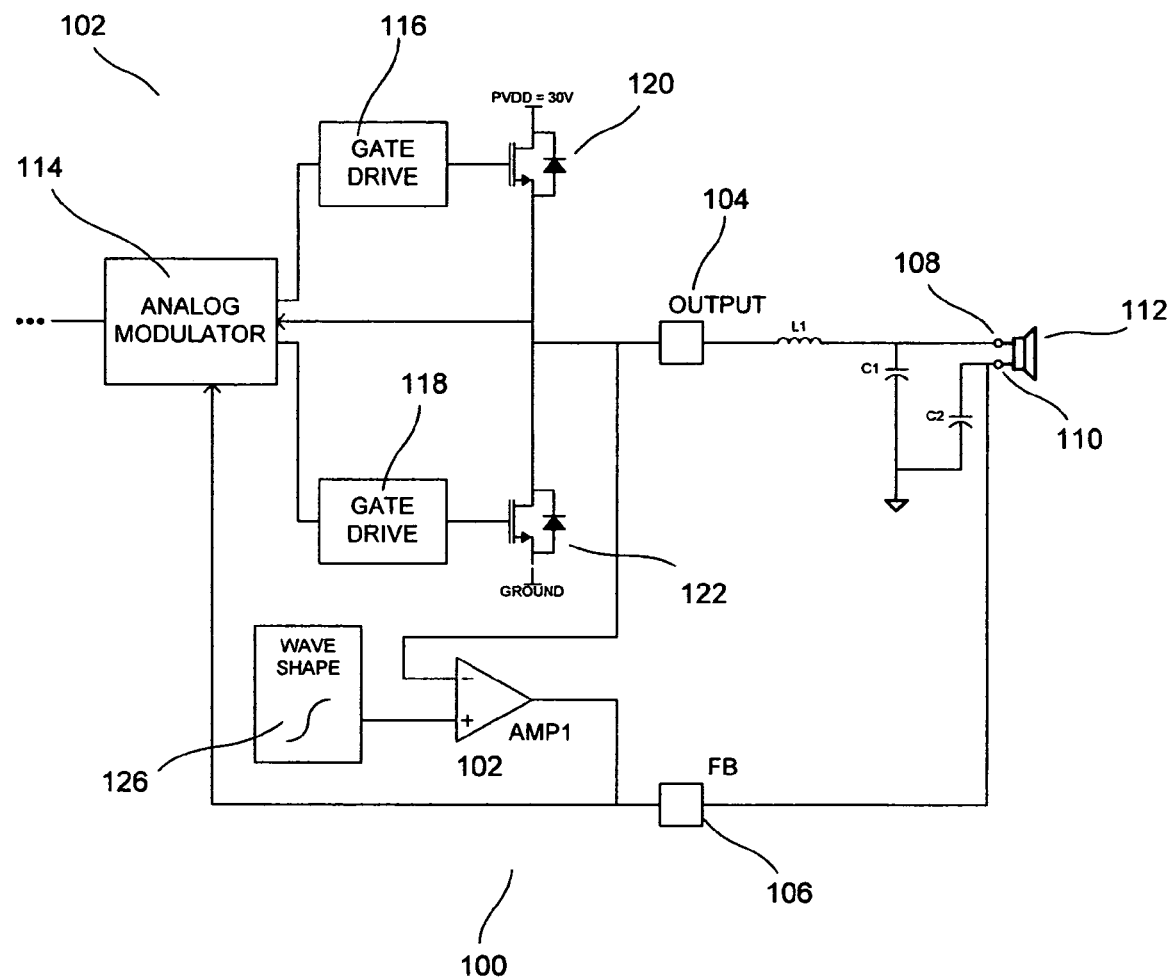
FIG. 1 is a simplified schematic diagram depicting an example of a preferred embodiment of an electronic circuit having pop and click noise reduction according to the invention.

Referring initially to FIG. 1, an example of a preferred embodiment of a pop and click noise reduction circuit 100 implementing the invention in the context of a class D amplifier is shown in a simplified schematic. A single-ended half-H bridge configuration 102 has an output node 104 and a feedback node 106 connected to the respective terminals 108, 110, of a load element, in this case a speaker 112. Other bridge circuits such as full bridge circuits may also be used. An analog modulator 114 is provided with gate drives 116, 118 connected to the output node 104 using suitable diodes 120, 122 in an arrangement suitable for driving the load element 112. An op amp 124 is provided for bringing the terminals 108, 110 of the speaker 112 to a mid-rail voltage level, in this example 15V. The circuit 100 is designed to charge the capacitors C1 and C2 located at the speaker 112 terminals 108, 110 to a selected level, while avoiding or attenuating transient current through the speaker 112 during this charging process. When a system (not shown) associated with the circuit 100 is powered up from an "off" state, the half-H bridge section 102 is also "off" (high-impedance state). In this state, the op amp 124 operates to charge the terminal 110, through the feedback node 106, to the mid-rail voltage level. Input to the op amp 124 is preferably provided by a wave-shape circuit block 126. The op amp 124 receives its feedback signal from the half-H bridge 102 output node 104, which is after the passive components L1, C1, and C2, around the speaker 112. In a suitable alternative arrangement, the feedback signal to the op amp 124 may also be taken directly from the half-H bridge 102 feedback node 106. A particular advantage may be realized by charging C2 through the feedback node 106 in the event that a large capacitor is used at C2. By charging C2 directly, the current flow through the speaker 112 is reduced. The shape of the waveform of the op amp 124 output signal provided at the speaker 112 is controlled by the wave-shape circuit 126, which can be implemented in the form of an RC network or a DAC controllable to output a selected voltage shape. The waveform shape required is determined by the LRC network (L1, C1, C2) around the speaker 112, and is designed to avoid or attenuate speaker 112 cone movement through limiting the flow transient currents through the speaker 112.

Figure 2:
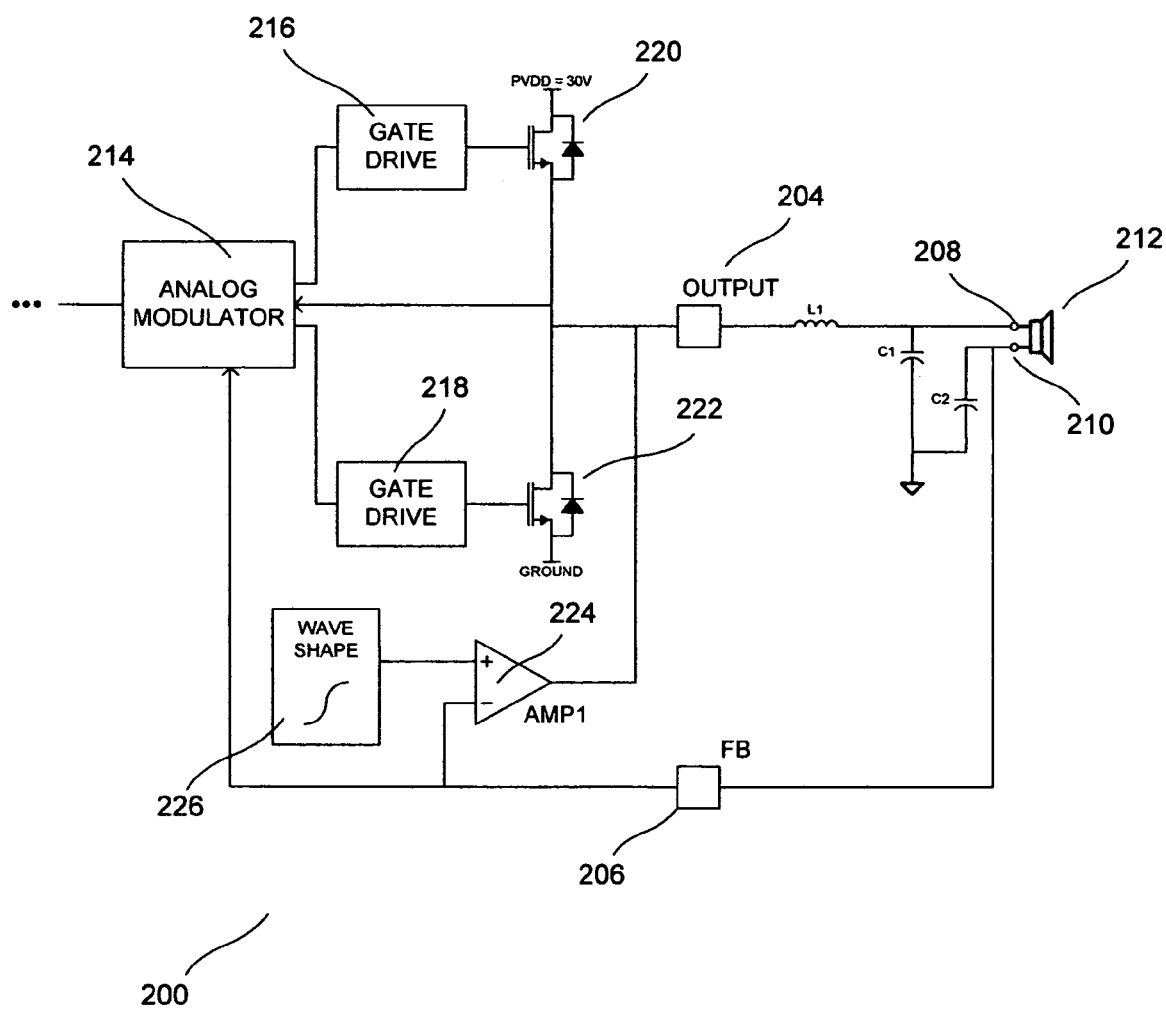
FIG. 2 is a simplified schematic diagram illustrating another example of a preferred embodiment of an electronic circuit having pop and click noise reduction according to the invention.

Now referring primarily to FIG. 2, an alternative embodiment of the invention is shown in a circuit 200 in which, as described above, the bridge configuration used is a single-ended half-H bridge arrangement 202 that has an output node 204 and a feedback node 206 connected to the respective terminals 208, 210, of a load element, e.g., speaker 212. In this example, the analog modulator 214 is also provided with gate drives 216, 218 connected to the bridge output node 204 using diodes 220, 222 in an arrangement adapted for driving the speaker 212. The op amp 224 is provided for bringing the terminals 208, 210 of the speaker 212 to a selected, e.g., mid-rail, voltage level (e.g., 15V) by a different path, however. When the circuit 200 is powered up from an "off" state, the op amp 224 operates to charge the terminal 208, through the output node 206 of the bridge 202, to the mid-rail voltage level. Input to the op amp 224 is again preferably provided by a wave-shape circuit block 226. In this example, the op amp 224 receives its feedback signal from the half-H bridge 202 feedback node 206. In an alternative configuration, the feedback signal to the op amp 224 may also be taken from the half-H bridge 202 output node 204. As above, the shape of the waveform of the signal op amp 224 output signal provided at the speaker 212 is controlled by the wave-shape circuit 226, which can be implemented in the form of an RC network or a DAC controllable to output a selected voltage signal shape.

Figure 3:
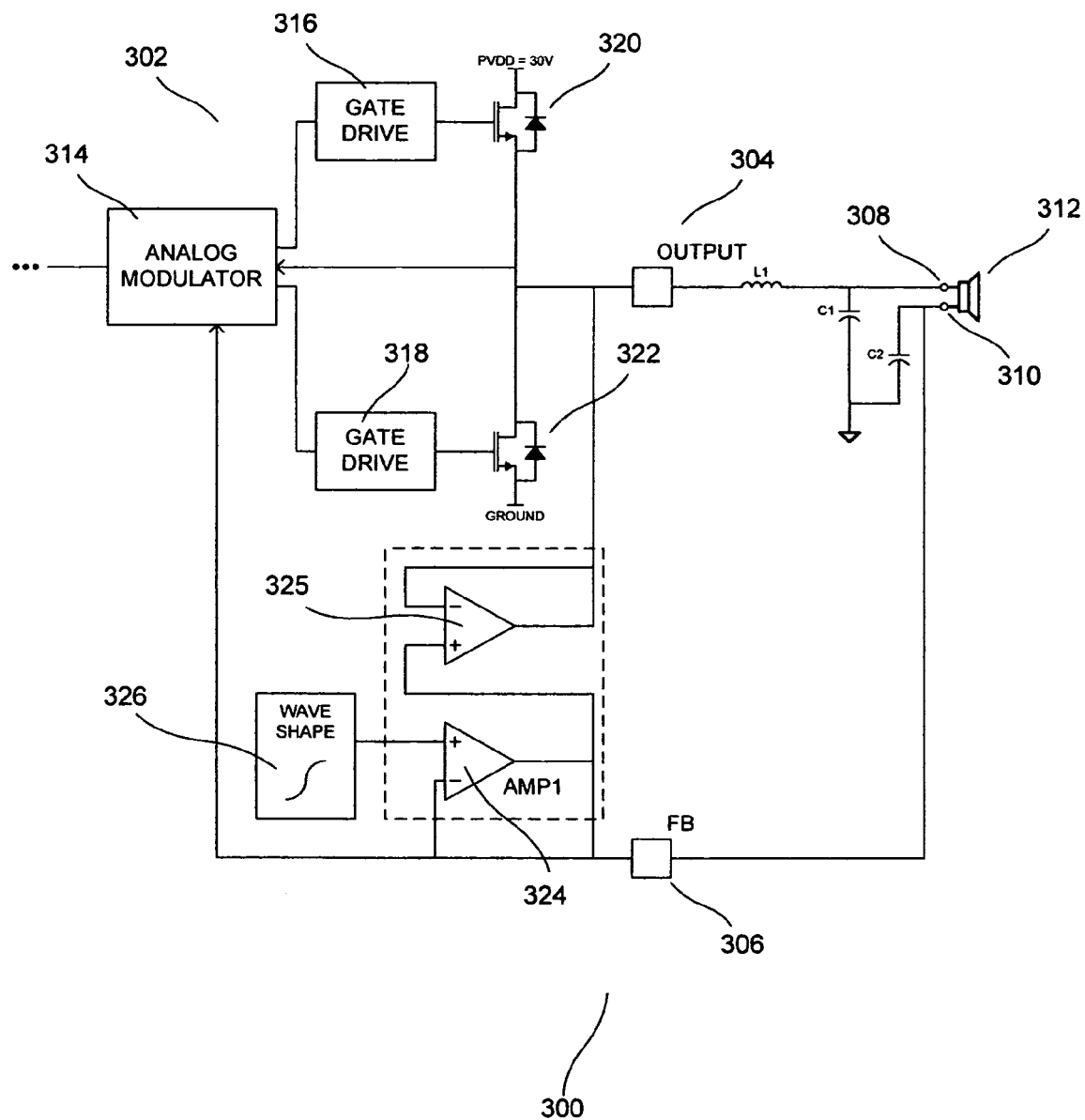
FIG. 3 is a simplified schematic diagram of a preferred embodiment of the invention in another example of an electronic circuit having pop and click noise reduction.

In an exemplary preferred embodiment of the invention portrayed in FIG. 3, a circuit 300 is shown in which both the bridge 302 output node 304 and feedback node 306 are brought to a mid-rail voltage level together. This has the advantage of charging all capacitors (e.g., C1, C2) without any current flow through the load circuit 312. The H-bridge 302 output node 304 and feedback node 306 are connected to the terminals 308, 310, of a load 312. An analog modulator 314 is preferably provided with gate drives 316, 318 connected to the output node 304, using diodes 320, 322, for driving the speaker, or other load element 312. A first op amp 324 is provided for bringing the bridge feedback node 306 and the corresponding terminal 310 of the speaker 312 to a mid-rail voltage level. The output of the first op amp 324 also serves as the input to a second op amp 325. The output from the second op amp 325 is coupled with the bridge output 304, and in turn to the corresponding terminal 308 of the speaker 312. Thus configured, the circuit 300 is designed to charge the capacitors C1 and C2, while avoiding applying current through the load circuit 312. The Input to the first op amp 324 is preferably provided by a wave-shape circuit 326, and this in turn is also the input to the second op amp 325. The first op amp 324 receives its feedback signal from the bridge 302 feedback node 306. Alternatively, the feedback signal to the first op amp 324 may also be obtained from the bridge 302 output node 304. The second op amp 325 receives its feedback signal from the half-H bridge 302 output node 304, or in the alternative, from the bridge 302 output node 304. Many variations of the circuit are possible without departure from the invention. For example, the two-amplifier approach having a master amplifier and a slave amplifier, as shown in FIG. 3, may alternatively be implemented similar to common-mode feedback in fully differential amplifier topologies.

Figure 4:
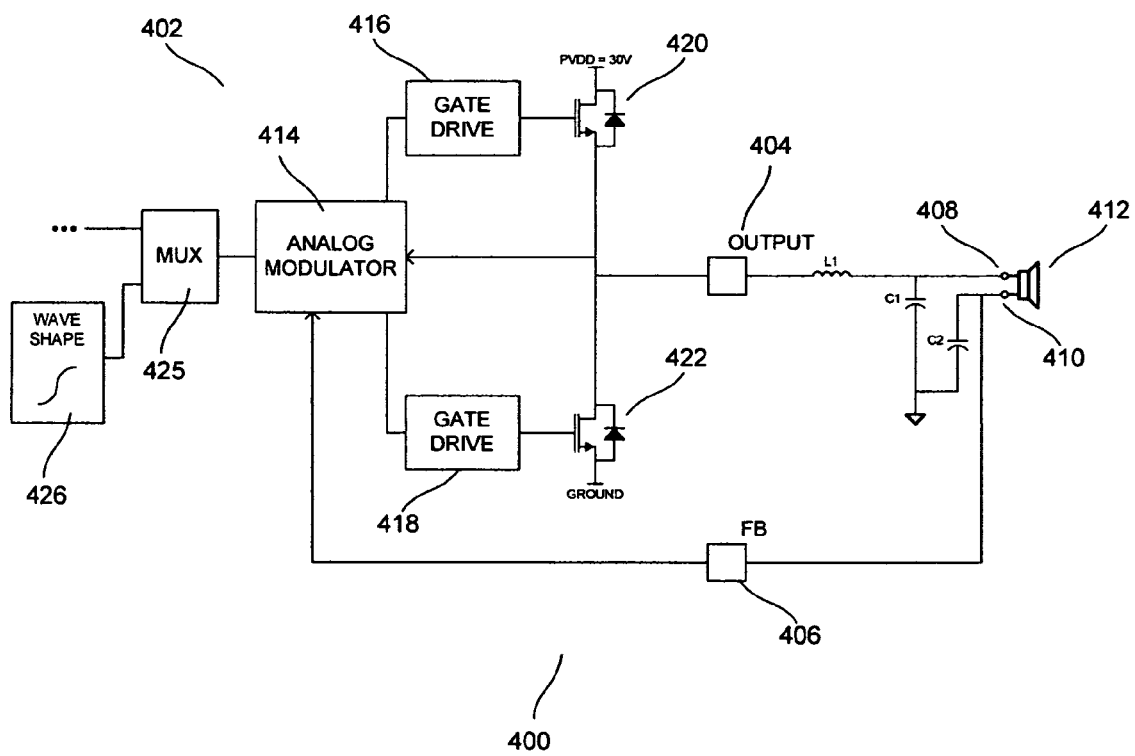
FIG. 4 is a simplified schematic diagram representing further examples of preferred embodiments of electronic circuits having pop and click noise reduction according to the invention.

FIG. 4 shows an implementation of a pop and click noise reduction circuit 400 using the class-D amplifier directly to bring up the mid-rail voltage. This preferred embodiment is similar to the circuit introduced in FIG. 2, with the distinction that the class-D amplifier is used to apply a noise reduction signal to the load instead of the op amp (224, FIG. 2). A single-ended half-H bridge 402 has an output node 404 and a feedback node 406 connected to the respective terminals 408, 410, of a speaker 412. A full bridge may also be used, as may another type of load element. As in the other exemplary circuits herein, an analog modulator 414 is provided with gate drives 416, 418 connected to the bridge output node 404 using diodes 420, 422 in an arrangement adapted for driving the load element(s) 412. Equivalent circuits may also be used. A selector circuit 425, such as a MUX, is provided between an associated system (not shown) that supplies an external signal, and a wave-shape circuit 426. The selector circuit 425 is configured for selecting either the external signal, typically an audio signal, or a wave-shape circuit 426 output signal for transmittal to the H-bridge output node 404. In the absence of an external signal, the selector circuit 425 selects the wave-shape circuit 426 output signal to apply to the bridge output node 404. Preferably, the signal so provided brings the terminals 408, 410 of the load 412 to a selected voltage level, e.g., mid-rail voltage. When the selector circuit 425 detects an external signal, it switches to transmit said external signal to the bridge output node 404. The shape of the waveform of the signal from the wave-shape circuit 426 may be configured as needed, based on selection of RC network components or using a DAC controllable to output a selected voltage shape, for example.

Figure 5:
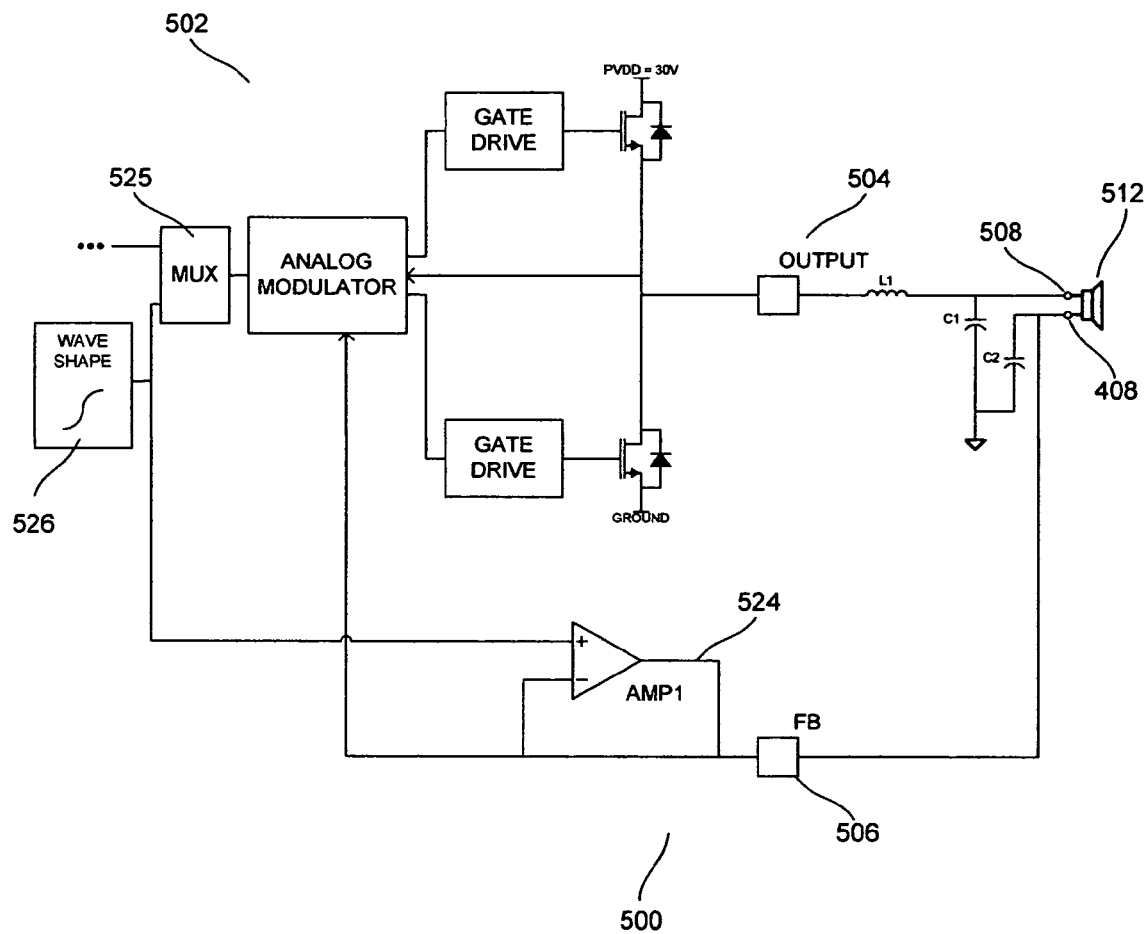
FIG. 5 is a diagram of an exemplary embodiment of the present invention.

Many variations of the pop and click noise reduction circuitry and related methods shown and described are possible within the scope of the invention. An example of an additional implementation is shown in FIG. 5, in which the circuit 500 includes a combination of using a single-ended half-H bridge 502 configuration to bring up one terminal 508 (at bridge output node 504) of the load 512, and a linear op amp 525 to bring up the bridge feedback node 506 connected with the other terminal 510 of the load 512. As shown, a selector circuit 525 is used to select between an external signal and a signal generated by a wave-shape circuit 526 as in the embodiment shown in and described with respect to FIG. 4. In this example, the signal provided by the wave-shape circuit 526 is provided to both the class-D amplifier portion 502 of the circuit 500 and as an input to the op amp 524. In an alternative arrangement, the output of the op amp 524 may be used to provide the wave-shape circuit 526 output signal to the class-D amplifier 502 in order to minimize offsets, and the output of the class-D may be filtered and provided to the input of the op amp 524. This and the other embodiments and techniques described and illustrated herein may be used in combination and with fully differential class-D architectures as well.

The circuits and techniques of the invention provide one or more advantages including but not limited to, reduction or elimination of pop and click noise in audio circuits. While the invention has been described with reference to certain illustrative embodiments, those described herein are not intended to be construed in a limiting sense. For example, variations or combinations of steps or materials in the embodiments shown and described may be used in particular cases without departure from the invention. All of the aspects of implementations of the pop and click noise reduction techniques described and shown can be combined in various ways. Various modifications and combinations of the illustrative embodiments as well as other advantages and embodiments of the invention will be apparent to persons skilled in the arts upon reference to the drawings, description, and claims.

We claim:
1. An electronic circuit comprising:
 a load circuit having a load element and first and second terminals, the terminals each further comprising a capacitor;
 a bridge circuit having an output node operably coupled with the first load terminal and a feedback node operably coupled with the second load terminal;
 an op amp operably coupled to receive an input signal and to supply an output signal to the feedback node;
 wherein the op amp output signal is configured to bring the terminals of the load circuit to a selected voltage level; and
 wherein the op amp receives a feedback input from a load circuit terminal and turns off when the voltage level at the load circuit is not zero.

2. The electronic circuit of claim 1 wherein the op amp receives feedback input from a load terminal and turns off when the load receives a signal at the output node of the bridge circuit.

3. The electronic circuit of claim 1 wherein the bridge circuit further comprises a single-ended half-H bridge circuit.

4. The electronic circuit of claim 1 wherein the op amp receives feedback input from the output node.

5. The electronic circuit of claim 1 wherein the op amp receives feedback input from the feedback node.

6. The electronic circuit of claim 1, wherein the selected voltage level the op amp is used to bring the terminals of the load circuit to, consists of a mid-rail level.

7. The electronic circuit of claim 1 further comprising a wave-shape circuit operably coupled for providing an input signal to the op amp.

8. The electronic circuit of claim 1 further comprising a wave-shape circuit operably coupled for providing an input signal to the op amp, the wave-shape circuit further comprising an RC network.

9. The electronic circuit of claim 1 further comprising a wave-shape circuit operably coupled for providing an input signal to the op amp, the wave-shape circuit further comprising a digital-to-analog converter controllable to output a specific voltage signal shape.

10. An electronic circuit comprising:
 a load circuit having a load element and first and second terminals, the terminals each further comprising a capacitor;
 a bridge circuit having an output node operably coupled with the first load circuit terminal and a feedback node operably coupled with the second load circuit terminal;
 an op amp operably coupled to receive an input signal and to supply an output signal to the output node;
 wherein the op amp output signal is configured to bring the terminals of the load circuit to a selected voltage level; and
 wherein the op amp receives a feedback input from a load terminal and turns off when the voltage level at the load circuit is not zero.

11. The electronic circuit of claim 10 wherein the op amp receives feedback input from a load terminal and turns off when the load circuit receives a signal at the output node of the bridge circuit.

12. The electronic circuit of claim 10 wherein the op amp receives feedback input from the output node.

13. The electronic circuit of claim 10 wherein the op amp receives feedback input from the feedback node.

14. The electronic circuit of claim 10, wherein the selected voltage level the op amp is used to bring the terminals of the load circuit to, consists of a mid-rail level.

15. The electronic circuit of claim 10 further comprising a wave-shape circuit operably coupled for providing an input signal to the op amp.

16. The electronic circuit of claim 10 further comprising a wave-shape circuit operably coupled for providing an input signal to the op amp, the wave-shape circuit further comprising an RC network.

17. The electronic circuit of claim 10 further comprising a wave-shape circuit operably coupled for providing an input signal to the op amp, the wave-shape circuit further comprising a digital-to-analog converter controllable to output a specific voltage signal shape.

18. The electronic circuit of claim 10 wherein the load circuit further comprises a speaker element.

19. An electronic circuit comprising:
- a load circuit having a load and first and second terminals, the terminals each further comprising a capacitor;
- a bridge circuit having an output node operably coupled with the first load terminal and a feedback node operably coupled with the second load terminal;
- a first op amp operably coupled to receive an input signal and to supply an output signal to the bridge circuit feedback node and to supply the same output signal as a input signal to a second op amp coupled for providing an output signal to the bridge circuit output node;
- wherein the respective op amp output signals is configured to bring the terminals of the load to a selected voltage level without transiting the load;
- wherein the first op amp receives a feedback input from the bridge circuit feedback node and turns off when the voltage level at the node is not zero
- and the second op amp receives a feedback input from the output node and turns off when the voltage level at the node is not zero.

20. The electronic circuit of claim 19 wherein the op amp receives feedback input from a load terminal and turns off when the load receives a signal at the output node of the bridge circuit.

21. The electronic circuit of claim 19, wherein the selected voltage level the first and second op amps are used to bring the terminals of the load to, consists of a mid-rail level.

22. The electronic circuit of claim 19 further comprising a wave-shape circuit operably coupled for providing an input signal to the first op amp.

23. The electronic circuit of claim 19 further comprising a wave-shape circuit operably coupled for providing an input signal to the first op amp, the wave-shape circuit further comprising an RC network.

24. The electronic circuit of claim 19 further comprising a wave-shape circuit operably coupled for providing an input signal to the op amp, the wave-shape circuit further comprising a digital-to-analog converter controllable to output a specific voltage signal shape.

25. An electronic circuit comprising:
- a load circuit having a load and first and second terminals, the terminals each further comprising a capacitor;
- a single-ended half-H bridge circuit having an output node operably coupled with the first load terminal and a feedback node operably coupled with the second load terminal;
- a selector circuit having an output to the bridge circuit, and a first input operably coupled to receive an electronic signal, and a second input operably coupled to receive a signal from a wave-shape circuit;
- wherein the selector circuit is configured for selecting either the audio signal or the wave-shape signal for transmittal to the output node;
- whereby the wave-shape signal is applied to the output node in the absence of an output signal.

26. The electronic circuit of claim 25 wherein the wave-shape signal is applied for bringing the load terminals to a mid-rail voltage level.

27. An electronic circuit comprising:
- a load circuit having a load and first and second terminals, the terminals each further comprising a capacitor;
- a bridge circuit having an output node operably coupled with the first load terminal and a feedback node operably coupled with the second load terminal;
- a selector circuit having an output to the bridge circuit, and a first input operably coupled to receive an audio signal, and a second input operably coupled to receive a signal from a wave-shape circuit;
- an op amp operably coupled to receive an input signal from the wave-shape circuit and to supply an output signal to the feedback node;
- wherein the selector circuit is configured for selecting either the audio signal or the wave-shape signal for transmittal to the output node;
- whereby the wave-shape signal is applied to the output node and the feedback node of the bridge circuit in the absence of an output signal.

28. The electronic circuit of claim 27 wherein the wave-shape signal is applied for bringing the load terminals to a mid-rail voltage level.

29. The electronic circuit of claim 27 wherein the bridge circuit further comprises an H-bridge circuit.

\* \* \* \* \*